United States Patent [19]

Margrain

[11] 3,905,818

[45] Sept. 16, 1975

[54] METHOD OF MAKING PRINTED CIRCUITS

[75] Inventor: Pierre Margrain, Malakoff, France

[73] Assignee: Etablissements E. Ragonot, Malakoff, France

[22] Filed: Mar. 8, 1972

[21] Appl. No.: 232,731

[30] Foreign Application Priority Data

Mar. 9, 1971 France .............................. 71.08091

[52] U.S. Cl. .......................... 96/36.2; 96/37; 156/3; 156/11

[51] Int. Cl.$^{2}$............................................ G03C 5/00

[58] Field of Search........ 96/36.2, 37; 350/96, 96 B; 156/3, 8, 11, 345

[56] References Cited

UNITED STATES PATENTS

| | | | |
|---|---|---|---|
| 3,155,505 | 11/1964 | Shannon | 156/8 X |
| 3,313,223 | 4/1967 | Frantzen | 156/3 X |
| 3,423,205 | 1/1969 | Skaggs et al. | 156/11 X |
| 3,615,470 | 10/1971 | Singletary | 96/37 |
| 3,668,028 | 6/1972 | Short | 156/3 |

*Primary Examiner*—William A. Powell
*Attorney, Agent, or Firm*—Edwin E. Greigg

[57] ABSTRACT

In the manufacture of printed circuits wherein the configuration of the circuit is represented by exposed, residual portions of a photosensitive layer that protect the underlying metal zone while the remainder of the latter is etched away, the circuit is plotted on said photosensitive coating by means of at least one actinic light spot which is transmitted from the light source to the photosensitive film by an optical fiber strand and which is moved relative to said film.

9 Claims, 3 Drawing Figures

METHOD OF MAKING PRINTED CIRCUITS

BACKGROUND OF THE INVENTION

Electric circuits of the printed circuit type are usually formed from a metallic sheet of greater or lesser thickness bonded to an electrically insulating support base. The electric circuit to be constructed is usually drawn on the surface of the metallic sheet with a coating material which ensures that the coated, underlying zones of the metal sheet are protected against the corrosive effect of the chemical agents used. Those parts of the metallic sheet which are unprotected by the aforenoted coating are removed by the corrosive agents. In known processes, the plotting of the circuit design on the metallic sheet is effected either by printing the design with a special ink having the aforenoted protective properties or by coating the metallic sheet with a photosensitive material. Thereafter this material is exposed to actinic rays emanating from a special light source and passing through a template or positive image of the electric circuit. Subsequently, parts of the photosensitive material which remains or which becomes soluble are removed in a liquid bath or by means of a special solvent subsequent to the aforenoted exposure.

This invention utilizes the last-named, photosensitive process for making printed circuits.

In order to obtain an accurate tracing of the circuit in the known process, several conditions have to be met; the most important ones are discussed hereinafter.

The template containing the circuit design has to be of high contrast and has to be in close contact with the photosensitive layer during exposure. For this purpose the template and the metal sheet covered by the photosensitive material are usually disposed in a frame device in which a partial vacuum is generated in order to ensure a close contact between the template and the metal sheet. The actinic rays of the light source pass through the transparent or translucent portions of the template in order to reach the photosensitive layer and to effect in the zones of impact the desired chemical and physical transformations of the photosensitive layer. The intensity of the light source and its distance from each point of the assembly formed of the template and the photosensitive material on the metal sheet have a significant effect on the line quality of the obtained circuit. Furthermore, in the known process any desired modification of the circuit configuration necessarily requires the preparation of a new template for plotting the modified circuit.

OBJECT AND SUMMARY OF THE INVENTION

It is an object of the invention to provide an improved method and apparatus for printed circuit making which eliminates the afore-discussed disadvantages, which provides an economical manufacture of the printed circuits without using templates or intermediate masks.

Briefly stated, according to the invention, the tracing of an electric circuit is effected on a metal layer or foil by one or several actinic light spots which are moved with respect to the photosensitive film with which the metal foil or layer is coated. The apparatus for performing the afore-outlined method comprises at least one light spot projecting means and a mechanism to cause a relative movement between the light spots and the photosensitive film.

The printed circuits manufactured according to the afore-outlined process are characterized by one or several conductive layers in superposed insulated series carried by a support which may have any geometrical configuration: it may be planar, prismatic, cylindrical, spherical, etc. Electric printed circuits of this type may find particular application in certain types of rotary electric machines which are characterized in that they comprise a rotor, the windings of which are formed with the process according to the invention.

The invention will be better understood as well as further objects and advantages become more apparent from the ensuing specification of several exemplary embodiments.

DESCRIPTION OF THE EMBODIMENTS

As it has been noted earlier, the method according to the invention for making printed circuits permits the manufacture of electric circuits having supports of any desired geometrical configuration.

Figure 1:
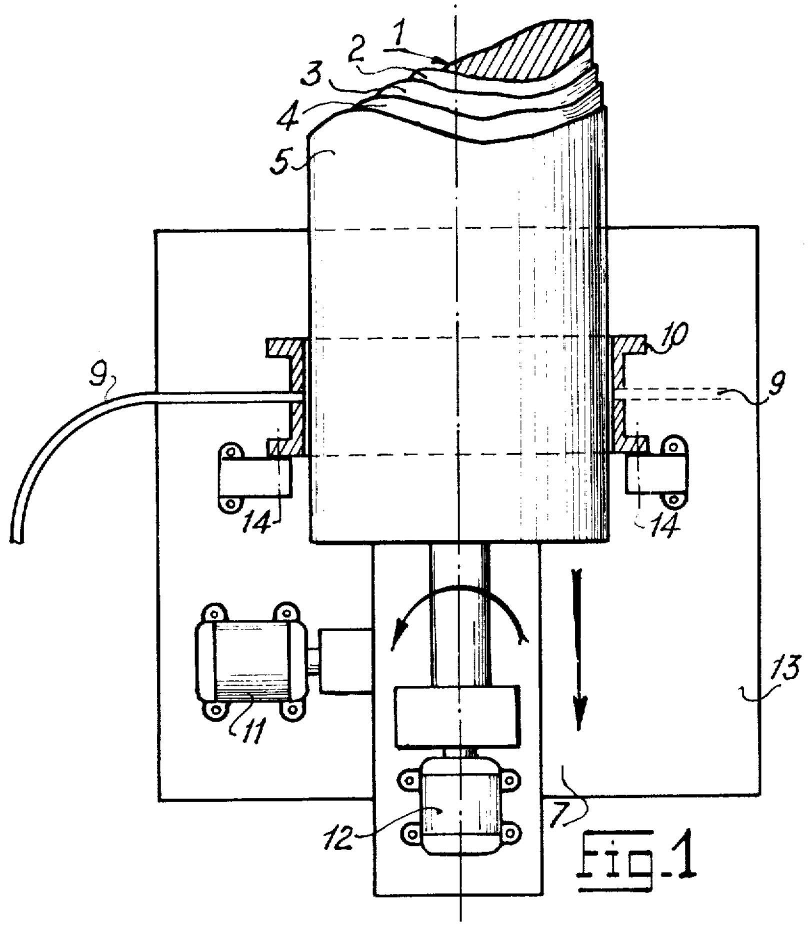
FIG. 1 is a schematic, partially sectional fragmentary top plan view of a preferred embodiment of an apparatus according to the invention.

In the example illustrated in FIG. 1, the electric circuit to be formed will be carried on the electrically insulated external face of a cylindrical support and will comprise a sole layer of parallel conductors uniformly spaced from one another and forming an acute angle with the longitudinal axis of the circuit.

In FIG. 1 the aforenoted cylindrical support is constituted by a cylinder 1 which may be made entirely of an electrically insulating material or may be made of a metal core 2 surrounded by an electrically insulating material 3.

To the electrically insulating layer 3 there is affixed a metal (for example, copper) foil 4 from which the aforenoted equally spaced parallel conductors of the circuit will be formed. It is to be understood that the component 4 may also be formed as a metal coating deposited on the base 1, 2, 3.

During the process of forming said conductors from the foil 4 by exposing the same to a corrosive agent such as iron chloride, those parts of the foil 4 which will eventually form the conductors have to be protected against the aforenoted chemical attack. For this purpose, the entire surface of the foil 4 is coated with a photosensitive film 5. When this film is exposed to actinic (ultraviolet) light such as solar light, arc lamp light or a mercury lamp light, its properties change. According to its composition, the photosensitive film may be initially soft or soluble in a solvent and becomes hard or insoluble in the said solvent after exposure or conversely. After exposure to the actinic light, the soluble or soft parts of the photosensitive film or those which became soluble or soft are dissolved and/or removed mechanically from the foil 4. The insoluble and hard parts of the photosensitive film which remain on the base 1, 2, 3 constitute the configuration of the electric circuit. Since these parts are insensitive to the corrosive agent, they protect the underlying portions of the foil 4. If the photosensitive material used is initially soluble or soft and becomes insoluble or hard after exposure, the configuration of the conductors of the electric circuit to be manufactured is constituted by the parts of the said material exposed to the actinic light. If, on the other hand, the photosensitive material used is initially insoluble or hard and becomes soft or soluble after exposure, the configuration of the conductors of the electric circuit to be manufactured is constituted by those parts of the photosensitive material which are protected from the exposure to the actinic light.

In the known processes the tracing of the conductors of an electric circuit on a photosensitive film has always required the use of either a template or a positive image of the circuit. The template of the positive image is interposed between the source of the actinic light and the photosensitive film. The clear, transparent or translucent portions of the template or the positive image transmits the actinic light rays which, in the zones of impact, change the properties of the photosensitive film. A sharp and accurate tracing is obtained only if the template or the positive image is of very high contrast and is firmly applied against the photosensitive film. Furthermore, in the manufacture of an electric circuit according to the abovenoted known process, the slightest modification to be made in the circuit design requires the use of a new template or a new positive image for reproducing on the photosensitive film the modified circuit configuration.

By practicing the present invention, the aforenoted disadvantages are eliminated because the use of a template or a positive image is no longer required for tracing the electric circuit on the photosensitive film.

According to the invention, the tracing of the electric circuit is effected by directly projecting one or several actinic light spots on the photosensitive film and moving said light spots with respect thereto. In the example illustrated in FIGS. 1 and 2, there is provided a light spot projecting apparatus 6 and a device for causing relative movement between these light spots and the photosensitive film 5. In the example shown in FIG. 1, the last-named means to cause such relative movement is a mechanism that carries the cylindrical assembly 1, 2, 3, 4, 5.

The apparatus for projecting the light spots according to the invention comprises an actinic light source 8, one or several optical fiber strands 9 and a light spot applicator 10. The actinic light source 8 may be constituted, for example, by an arc lamp, a mercury vapor lamp, a solar lamp or any other type of source which emits an actinic light. In the device according to the invention the actinic light emitted by the source 8 is transformed into light spots and conveyed to the light spot applicator 10 by means of the optical fiber strands 9. By virtue of this system the light spots obtained are advantageous in that they all have the same light intensity and may be controlled with a high degree of flexibility. The light spot applicator 10 is formed by a sleeve having along its periphery throughgoing openings into which the end of an optical fiber strand 9 is fitted. The sleeve 10 closely surrounds the photosensitive layer 5 and thus the light-emitting terminal of each optical fiber strand 9 is held continuously in close vicinity of the photosensitive film 5. Thus, the inner face of the light spot applicator 10 preferably has a configuration which conforms to the surface of the photosensitive film 5. In the example illustrated in FIGS. 1 and 2, both the photosensitive film 5 and the applicator 10 have a cylindrical surface.

The mechanism 7 which carries the assembly 1–5 and which cooperates with the light spot projecting device in tracing the electric circuit on the photosensitive layer 5, comprises a first motor 11 or any equivalent means which displaces the aforenoted assembly in a longitudinal direction and a second motor 12 or equivalent means which imparts a rotation thereto.

If the printed circuit to be constructed is constituted by parallel conductors which are spaced uniformly on a cylindrical surface and which form an acute angle with the axis of the cylinder, a simultaneous tracing of a plurality of these conductors on the photosensitive film 5 (FIG. 1) is effected according to the invention by using a plurality of optical fiber strands 9. The applicator 10 may be affixed to the frame 13 by screws 14 in a stationary manner, while the motors 11, 12 move the assembly 1–5. During the linear and rotary motions of the assembly 1–5, the actinic light spots, which are emitted by the ends of the optical fiber strands 9 held in the applicator 10, impinge directly on the photosensitive film 5 and simultaneously trace the configuration of the conductors of the circuit. Thus, in the zones of impact the actinic light spots cause a change in the properties of the photosensitive film 5. The travelling speed of the light spots is so determined that the photosensitive film is exposed to the actinic light for a sufficient duration. By removing the soft or soluble zones of the photosensitive film 5, there remains on the metal foil 4 a circuit configuration of hard or insoluble material which protects the underlying metal zones against the attacks of a corrosive agent during the etching operation performed on the metal foil 4.

In the example illustrated in FIG. 1, if it is desired to modify the circuit design to obtain, for example, uniformly spaced conductors that are disposed parallel to the axis of the circuit, no modification of any component is necessary. All that has to be done is to energize solely the motor 11 which effects a purely linear (axial) displacement of the assembly 1–5. Similarly, if one desires to modify the angle which the conductors form with the axis of the circuit, merely the relative speeds of motors 11 and 12 have to be changed. The direction of rotation of the motor 12 determines whether the conductors are right-hand or left-hand helices.

It is thus seen that with the method according to the invention the plotting of the printed circuit is made particularly simple and further, a uniform sharpness of high degree of the plotted conductor lines in all points of the photosensitive film 5 is at all times ensured.

Figure 2:
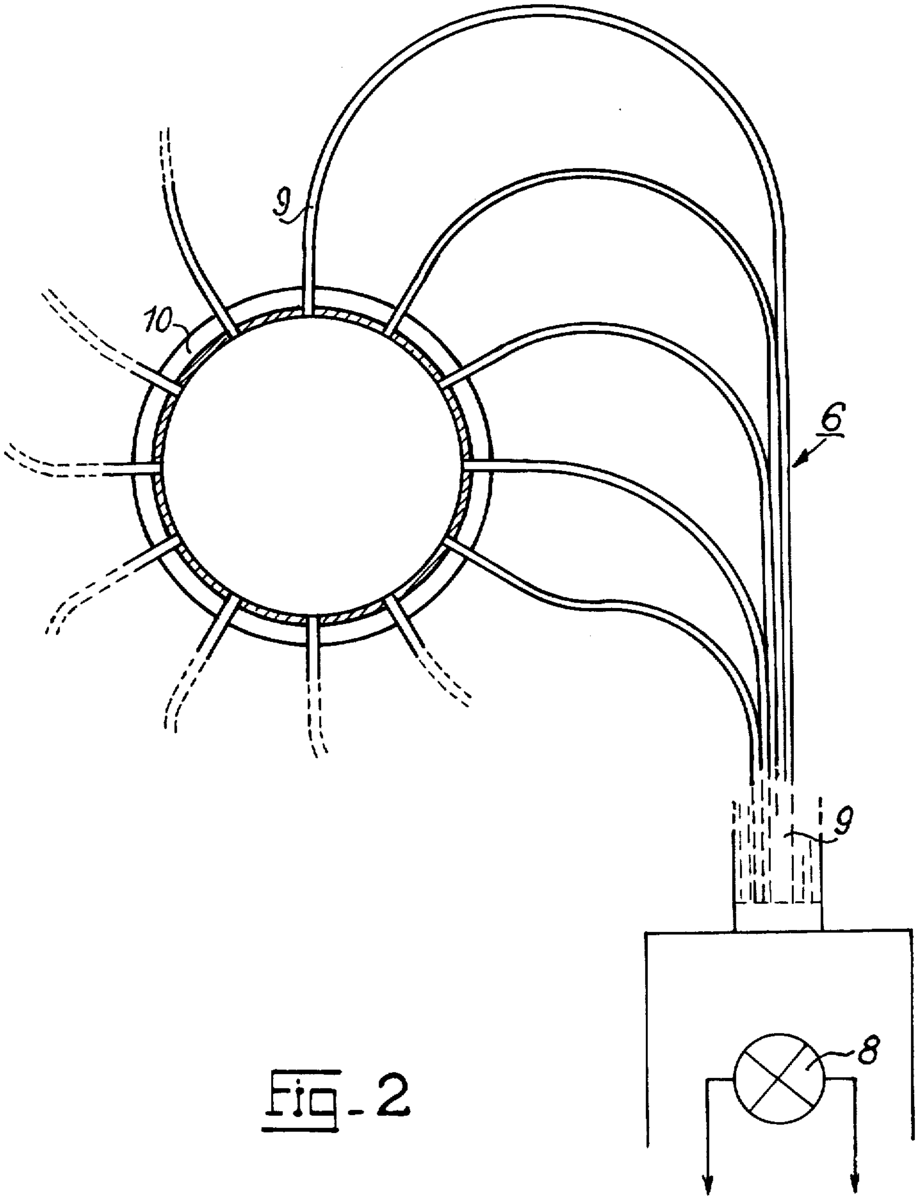
FIG. 2 is a schematic, fragmentary view partially in section taken in the direction of the rotary axis indicated in FIG. 1

In the apparatus 6 for the projection of the light spots illustrated in FIG. 2, the number of the optical fiber strands 9 is equal to the number of the conductors to be traced. According to the invention, the apparatus 6 may comprise a single optical fiber strand or a number which is smaller than the number of conductors of the circuit to be traced. In the latter case the complete tracing of all of the conductors of the circuit is executed in several operational steps.

Dependent upon the afore-discussed properties of the photosensitive material used, the actinic light spots are designed to trace either the course of the conductors or the spacings therebetween.

In a variant (not shown) for practicing the invention, in order to effect the tracing of the circuit configuration on the photosensitive film 5, the device 7 for carrying the assembly 1–5 is maintained stationary whereas the light spot applicator 10 is displaced longitudinally with respect thereto and is rotated about its axis.

It is readily seen that the method according to the invention may be practiced, for example, in case of a planar assembly formed of a base, a metal layer and a photosensitive layer. In such a case the light spot applicator is preferably also planer. Two motors may serve to effect a relative displacement of the assembly and the light spot in a longitudinal and in a transversal direction.

The printed circuit which is carried on a cylindrical base and prepared with the aid of an apparatus illustrated in FIGS. 1 and 2 may find particular application as the electric winding on the rotor of a rotary electric machine.

Figure 3:
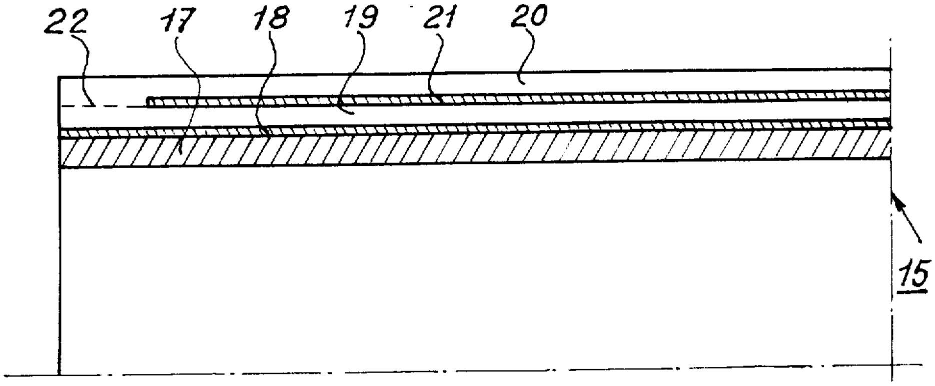
FIG. 3 is a schematic fragmentary sectional view of a rotor of a rotary electric machine incorporating the printed circuit manufactured according to the invention.

With the method according to the invention a multilayer, superposed, serially connected printed circuit assembly may be built for serving as a rotor winding as illustrated in FIG. 3. The rotor 15 of a rotary electric machine comprises a hollow metal core 17 provided with an electrically insulating layer 18, a first layer of conductors 19, a second layer of conductors 20, which are in series with the first layer of conductors 19 and an electric insulating layer 21 which, separates the two superposed conductor layers 19 and 20.

In manufacturing the electric winding of the rotor 15, on the insulating layer 18 of the metal core 17 of the rotor 15 there is deposited a first continuous metal layer 19. Subsequent to a coating of layer 19 with a photosensitive film, the tracing of an electric circuit on the photosensitive film is effected according to the invention as explained in detail earlier. Therafter, the etching of the conductors into the metal layer 19 by a corrosive agent may be performed in a manner also described hereinbefore.

The residual photosensitive material is removed and thereafter the terminals 22 of the conductors 19 which have to be connected in series with the conductors formed of a second metal layer 20 are coated with lacquer, paint or removable resin (not shown) prior to the deposition of an insulating coating 21 which coats the conductors formed of the first metal layer 19. The deposition of the uniformly thick insulating layer 21 may be effected by any known means, such as spraying, submersion, electrophoresis, or the bonding of insulating sheets.

After removal of the lacquer, paint or resin layer which covers the terminals 22 of the conductors, a second metal layer 20 is deposited thereon and on the insulating coating 21 by any known metalizing means. Thus, the series connection of the conductors of the first layer 19 with those of the second layer 20 is effected automatically and without soldering.

After coating the metal layer 20 with a photosensitive film, the tracing of the conductors on said film and the etching of the metal layer 20 are effected as described before.

The same operations may be repeated to provide as many insulated layers of superposed, serially connected conductors as desired.

With the process and the apparatus according to the invention, multilayer printed circuits may be formed in a simple manner wherein the conductors associated with different layers cross each other in space. The conductors of the first metal layer 19 thus may, for example, be left-hand helices whereas those of the second layer 20 may be right-hand helices.

The process according to the invention further makes possible to effect the tracing of a circuit when the metal layer 4 and the photosensitive film 5 which covers the latter are disposed, for example, on the internal face of a tubular member. In such a case, the ends of the optical fiber strands are so mounted on the periphery of the annular light spot applicator 10 that the light rays are directed radially outwardly.

What is claimed is:

1. In a method of making a printed circuit, including the successive steps of (a) exposing to actinic light according to the pattern of said circuit, portions of a photosensitive film deposited on a metal layer supported by an insulating base, (b) removing those portions of said film from said metal layer that are separable therefrom subsequent to step (a), (c) etching away those portions of said metal layer that are exposed as a result of step (b) and (d) removing those portions of said film that protected portions of said metal layer during step (c), said last-named portions of said metal layer constituting the conductors of said printed circuit, the improvement in step (a) comprising the steps of:

A. causing at least one actinic light spot to impinge on said photosensitive film;

B. causing a relative movement between said light spot and said photosensitive film according to a predetermined pattern to effect a tracing of the desired circuit configuration by said light spot on said photosensitive film;

including the following successive and cyclically repetitive steps subsequent to step (d) to provide a printed circuit formed of a desired number of insulated, serially connected conductor assemblies:

C. coating the terminal portions of each conductor with a lacquer;

D. coating the total surface of said conductors with a coherent insulating layer;

E. removing the lacquer coating from said conductors to expose the terminal portions thereof;

F. coating said exposed terminal portions and said insulating layer with a metal layer;

G. coating said last-named metal layer with a photosensitive film;

H. tracing a desired conductor configuration on said last-named photosensitive film by moving an impinging actinic light spot on said last-named photosensitive film; and I. etching away those portions of the last-named metal layer that are subsequent to step (H) removable by a corrosive agent.

2. An improvement as defined in claim 1, wherein step (B) includes the steps of maintaining said light spot stationary and moving said photosensitive film with respect thereto.

3. An improvement as defined in claim 1, wherein step (B) includes the steps of maintaining said photosensitive film stationary and moving said light spot with respect thereto.

4. In a method of making a printed circuit, including the successive steps of (a) exposing to actinic light according to the pattern of said circuit, portions of a photosensitive film deposited on a metal layer supported by an insulating base, (b) removing those portions of said film from said metal layer that are separable therefrom subsequent to step (a), (c) etching away those portions of said metal layer that are exposed as a result of step (b) and (d) removing those portions of said film that protected portions of said metal layer during step (c), said last-named portions of said metal layer constituting the conductors of said printed circuit, the improvement in step (a) comprising the steps of:

A. positioning an end of at least one optical fiber strand in the vicinity of said photosensitive film;
B. causing an actinic light spot to exit from said end of said optical fiber strand and thence impinge on said photosensitive film; and
C. causing a relative movement between said end of said optical fiber strand and said photosensitive film according to a predetermined pattern to effect a tracing of the desired circuit configuration by said light spot on said photosensitive film; and further including the following successive and cyclically repetitive steps subsequent to step (d) to provide a printed circuit formed of a desired number of insulated, serially connected conductor assemblies:

D. coating the terminal portions of each conductor with a lacquer;
E. coating the total surface of said conductors with a coherent insulating layer;
F. removing the lacquer coating from said conductors to expose the terminal portions thereof;
G. coating said exposed terminal portions and said insulating layer with a metal layer;
H. coating said last-named metal layer with a photosensitive film;
I. tracing a desired conductor configuration on said last-named photosensitive film by moving at least one impinging actinic light spot on said last-named photosensitive film; and
J. etching away those portions of the last-named metal layer that are subsequent to step (I) removable by a corrosive agent.

5. An improvement as defined in claim 5, wherein step (C) includes the steps of maintaining said end of said optical fiber strand stationary and moving said photosensitive film with respect thereto.

6. An improvement as defined in claim 4, wherein step (C) includes the steps of maintaining said photosensitive film stationary and moving said end of said optical fiber strand with respect thereto.

7. An improvement as defined in claim 4, wherein step (A) includes positioning of respective ends of a plurality of optical fiber strands in the vicinity of said photosensitive film; step (B) includes causing respective actinic light spots to exit from said respective ends of said optical fiber strands and thence impinge on said photosensitive film; and step (C) includes causing relative movement between said ends of said optical fiber strands and said photosensitive film according to a predetermined pattern to effect tracing of the desired circuit configuration by said light spots on said photosensitive film.

8. An improvement as defined in claim 7, wherein step (C) includes the steps of maintaining said ends of said optical fiber strands stationary and moving said photosensitive film with respect thereto.

9. An improvement as defined in claim 7, wherein step (C) includes the steps of maintaining the photosensitive film stationary and moving said ends of said optical fiber strands with respect thereto.

* * * * *